United States Patent [19]
Rubin

[11] 4,099,175
[45] Jul. 4, 1978

[54] CHARGE-COUPLED DEVICE DIGITAL-TO-ANALOG CONVERTER

[75] Inventor: Barry Jay Rubin, Wappingers Falls, N.Y.

[73] Assignee: International Business Machines Corporation, Armonk, N.Y.

[21] Appl. No.: 736,970

[22] Filed: Oct. 29, 1976

[51] Int. Cl.² .......................................... H03K 13/02
[52] U.S. Cl. ........................ 340/347 DA; 307/221 D; 357/24
[58] Field of Search ................... 340/347 DA, 347 M; 357/24; 307/221 D, 221 C

[56] References Cited
U.S. PATENT DOCUMENTS 3,918,070  11/1975  Shannon ................................. 357/24
3,937,985  2/1976  Cooper ........................... 307/221 D

OTHER PUBLICATIONS

Schmid, Electronic Analog/Digital Conversions, Van Nostrand Reinhold Co., 1970, pp. 186, 187 & 200–203.

Primary Examiner—Thomas J. Sloyan
Attorney, Agent, or Firm—Robert J. Haase

[57] ABSTRACT

A serial digital-to-analog converter using charge-coupled device technology. The converter comprises, in tandem, an input charge source diffusion, an input charge storage gate, a pair of charge splitting gates and an output charge collecting diffusion. The diffusions and the charge storage and the charge splitting gates are separated from each other by respective control gates.

7 Claims, 6 Drawing Figures

CHARGE-COUPLED DEVICE DIGITAL-TO-ANALOG CONVERTER

BACKGROUND OF THE INVENTION

As is well understood, serial digital-to-analog conversion can be accomplished with the aid of charge storage devices and programmed switching means for selectively coupling the charge storage devices together. More particularly, the programming is so arranged that a fixed input charge (representing a binary 1 or 0) is summed with a pre-existing stored input charge (if any), the combined charges are split in half and one of the split halves is summed with the next input charge, etc., until input charges corresponding to all input serial binary bits have been so processed. The resulting charge in the charge splitter represents the analog value of the serial binary input. Such a technique is described in the book "Electronic Analog/Digital Conversions" by Hermann Schmid, VanNostrand Rhinehold Company, 1970, pages 186 and 187.

It is advantageous to implement the above-described conversion technique with the aid of charge-coupled device technology. Accordingly, diffusions in a semiconductor substrate are used to generate and to collect charges while insulated gate electrodes spaced from each other along a charge pathway between the diffusions provide the necessary charge storage and charge splitting functions. The gate electrodes must be energized in a predetermined manner to control the operation of the charge-coupled device (CCD) converter. Previously, each input digital signal was decoded to generate the necessary waveforms for application to the gate electrodes. Special control logic was provided to accomplish the required decoding. Such a technique is disclosed in copending patent application Ser. No. 644,000 filed Dec. 23, 1975 in the name of L. M. Terman, for "Digital-to-analog and Analog-to-digital Converter Circuit" and assigned to the present assignee. It is desirable, however, to provide a CCD-instrumented serial digital-to-analog converter utilizing a predetermined sequence of control waveforms for application to the respective gate electrodes independent of the value of the input digital number to be converted.

SUMMARY OF THE INVENTION

A serial digital-to-analog converter using charge-coupled device technology and comprising charge source and charge collection diffusions in a semiconductor substrate separated from each other by a series of gate electrodes. The gate electrodes are energized by a predetermined waveform sequence, independent of the value of the input digital numbers to be converted. Said gate electrodes provide charge storage and charge splitting wells in the substrate in response to applied potentials. In operation, a fixed input charge (representing a binary 1 or 0) is summed with a pre-existing stored input charge (if any), the combined charges are split in half and one of the split halves is summed with the next input charge, etc., until input charges corresponding to all input binary bits have been so processed. The resulting charge in the charge splitter is outputted through the charge collecting diffusion and represents the analog value of the binary input.

DESCRIPTION OF THE PREFERRED EMBODIMENT

Figure 1:
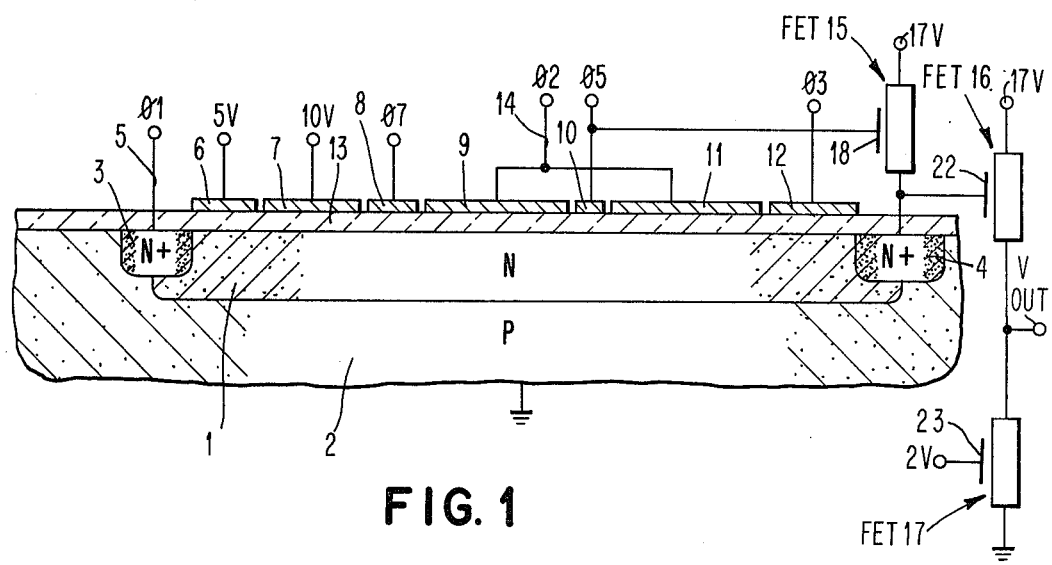
FIG. 1 is a simplified cross-sectional view of a preferred embodiment of the digital-to-analog converter of the present invention.

Buried channel charge-coupled devices are used to input, split, transfer and output the charge in the preferred embodiment of FIG. 1. The buried channel structure provides for high fringing fields which increase the speed of operation of the digital-to-analog converter. Alternatively, a surface charge-coupled device structure (having no N diffusion 1) also is suitable for use with the present invention.

N (buried channel) diffusion 1 is made in P substrate 2. Input N+ diffusion 3 and output N+ diffusion 4 are made into substrate 2 at opposite ends of diffusion 1. A voltage waveform, representing the serial bits of an input digital number (least significant bit first) which is to be converted to a corresponding analog value, is applied via line 5 to N+ diffusion 3. In the example to be described, an input voltage of 15 volts represents the binary value 0 whereas an input voltage of 8 volts represents the binary value 1. Charge is injected from N+ diffusion 3 when the input voltage waveform is at 8 volts. The injected charge travels from input diffusion 3 to output diffusion 4 under the control of a predetermined sequence of control voltage pulses which are applied to respective insulated gate electrodes located along the path of charge travel. Said gate electrodes comprise electrodes 6 to 12, inclusive, each of which is insulated from diffused substrate 2 by a thin silicon dioxide layer 13. Gate electrodes 9 and 11 receive the same control potential via line 14. Each of the other gate electrodes receive respective control potentials.

Figure 2A:
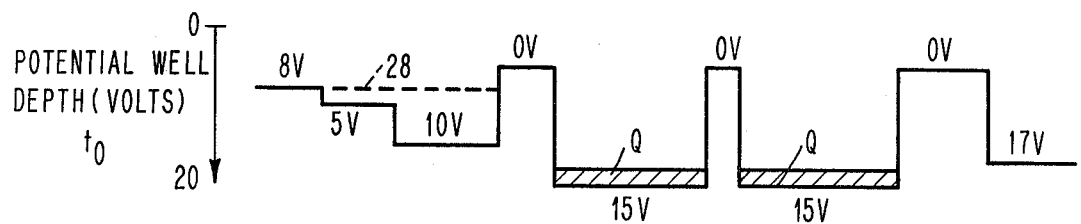
FIGS. 2A, 2B, 2C and 2D are a series of diagrams representing the control voltages and the resulting potential wells in the converter of FIG. 1 at respective times.
Figure 2B:
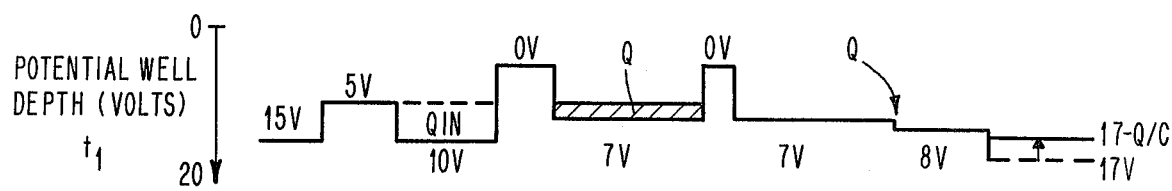
Figure 2C:
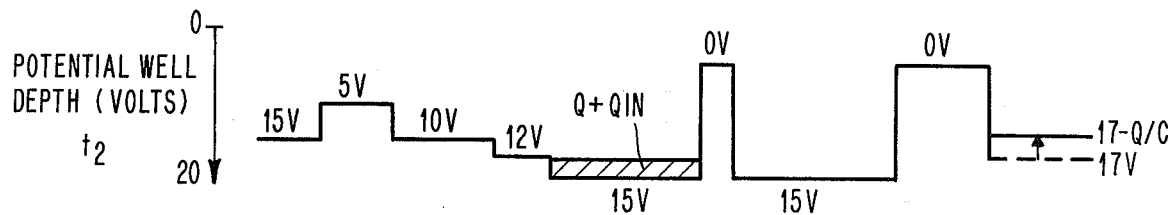

The control voltages applied to N+ diffusions 3 and 4 and gate electrodes 6 through 12 are represented by the numerals located adjacent the respective "steps" comprising the diagrams of FIGS. 2A, 2B, 2C and 2D. The levels of the "steps" represent the depths of the respective potential wells which are created in the N diffused area 1 as a result of the application of the indicated voltages to the overlying corresponding diffusions 3 and 4 and the gate electrodes 6–12. The diagram of FIG. 2A represents the amplitudes (plotted negatively) of the potential well depths which are simultaneously produced at time $t_0$ by the indicated voltages applied to respective diffusions and gate electrodes. The diagrams of FIGS. 2A through 2D are aligned with the structure of FIG. 1 so that the value of each indicated voltage represents the voltage applied to the diffusion or gate electrode, as the case may be, aligned directly above. Thus, at time $t_0$, the voltages applied to diffusion 3, gates 6, 7, 8, 9, 10, 11 and 12 and output diffusion 4 are 8, 5, 10, 0, 15, 0, 15, 0 and 17 volts, respectively.

It should be noted that the use of the buried channel N layer 1 results in a potential well depth greater than the voltage applied to the overlying gate electrode. For example, a voltage of 5 volts applied to gate 6 produces a potential well depth of 10 volts. On the other hand, the potential well depth of a diffused area such as area 3 is equal to the voltage applied to said area.

FET 15 is used to reset and then isolate the N+ output diffusion 4. A source follower comprising FET's 16 and 17 is used as an output buffer. Transistors 15, 16 and 17 preferably may be integrated with the basic structure of the buried channel digital-to-analog converter as will be described later in connection with the embodiment shown in FIG. 3.

As is well understood, serial digital-to-analog conversions can be accomplished by appropriately summing a stored charge with an input charge, dividing the resulting charge in half and then summing the divided charge with the next following input charge, etc. The first input charge represents the least significant bit of the input number to be converted. Such conversion is accomplished by the preferred embodiment of the present invention represented in FIG. 1 upon application thereto of the voltages indicated represented by the diagrams of FIGS. 2A through 2D at the respective times $t_0$ through $t_3$. As an aid in understanding the operation of the preferred embodiment, the diagrams of FIGS. 2A through 2D have been plotted negatively, i.e., the upper portions of each diagram representing the less positive voltages and the lower portions of each diagram representing the more positive voltages. The adopted convention permits each voltage diagram also to be interpreted as a diagram of the potential wells created within diffused substrate 2 in response to the voltages applied to the respective diffusions and gate electrodes of FIG. 1.

Referring to the $t_0$ diagram of FIG. 2A, with 8, 5 and 10 volts applied to N+ diffusion 3, and gate electrodes 6 and 7, respectively, a charge is inputted (representing the binary value 1) to fill the potential wells underneath gate electrodes 6 and 7 of FIG. 1 to a level represented by the dashed line 28 of FIG. 2A. The input charge is trapped by the potential barrier underneath gate electrode 8 corresponding to a 0 voltage respectively applied thereto. To illustrate the general case wherein previous input charges have accumulated within the charge splitting wells underneath gate electrodes 9 and 11, such charges are represented by the shaded areas designated "Q" in each of the charge splitting wells. The charges within the wells are trapped by the potential barriers underneath gate electrodes 8 and 12 and are separated from each other by the potential barrier underneath gate 10, said gates receiving the applied potential of 0 volts.

At time $t_1$, the voltage applied to charge source diffusion 3 is reset to 15 volts allowing the excess charge represented by dashed line 28 of FIG. 2A to drain off leaving a standard pre-measured charge "$Q_{in}$" in the input storage potential well underneath electrode 7. At the same time, the voltage applied to gates 9 and 11 is reduced to 7 volts and the voltage applied to output gate 12 is increased to 8 volts. The result is that the charge Q in the charge splitting well underneath gate 11 is released and driven toward output N+ diffusion 4 (at 17 volts) where it is collected. The N+ diffusion potential is decreased by an amount equal to (Q/C) where Q is the collected charge and C is the total output capacitance encountered by the charge. The sensed charge represents the analog value of all previously inputted serial digits prior to the digit producing charge "$Q_{in}$" shown underneath electrode 7 in the diagram of FIG. 2B.

At time interval $t_2$, the voltage of gate 8 is increased to 12 volts, allowing the charge "$Q_{in}$" to be summed with the pre-existing charge "Q" in the charge splitting well underneath gate 9.

Figure 2D:
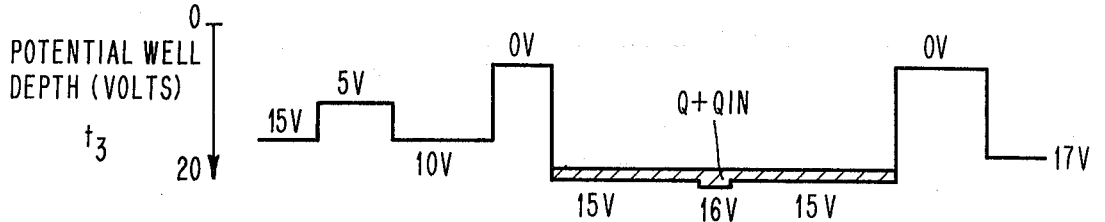

The resulting charge "$Q + Q_{in}$" is distributed equally between the charge splitting wells underneath the gate electrodes 9 and 11 at time $t_3$ by increasing the voltage applied to gate 10 to 16 volts. At the same time, the voltage at output N+ diffusion 4 is reset to 17 volts by turning on the gate of FET 15 which receives the same voltage as gate 10. This action completes one cycle of processing an input charge representing a respective serial bit of the input digital number. Upon the occurrence of the next succeeding input bit, the diagram of FIG. 2A again applies except that the charge sum ½ (Q + $Q_{in}$) of FIG. 2D is initially stored in each potential well underneath gates 9 and 11. Input diffusion 3 is raised to 8 volts if the next succeeding input binary bit also is a "1". If the next succeeding bit is a "0", source diffusion 3 remains at 15 volts and no charge is caused to flow into the potential wells underneath gates 6 and 7. It should be noted that the voltages discussed in connection with the diagrams of FIGS. 2A through 2D are illustrative only in that actual operating voltages depend upon the vertical geometry of the device represented in FIG. 1, as is well understood in the art.

Figure 3:
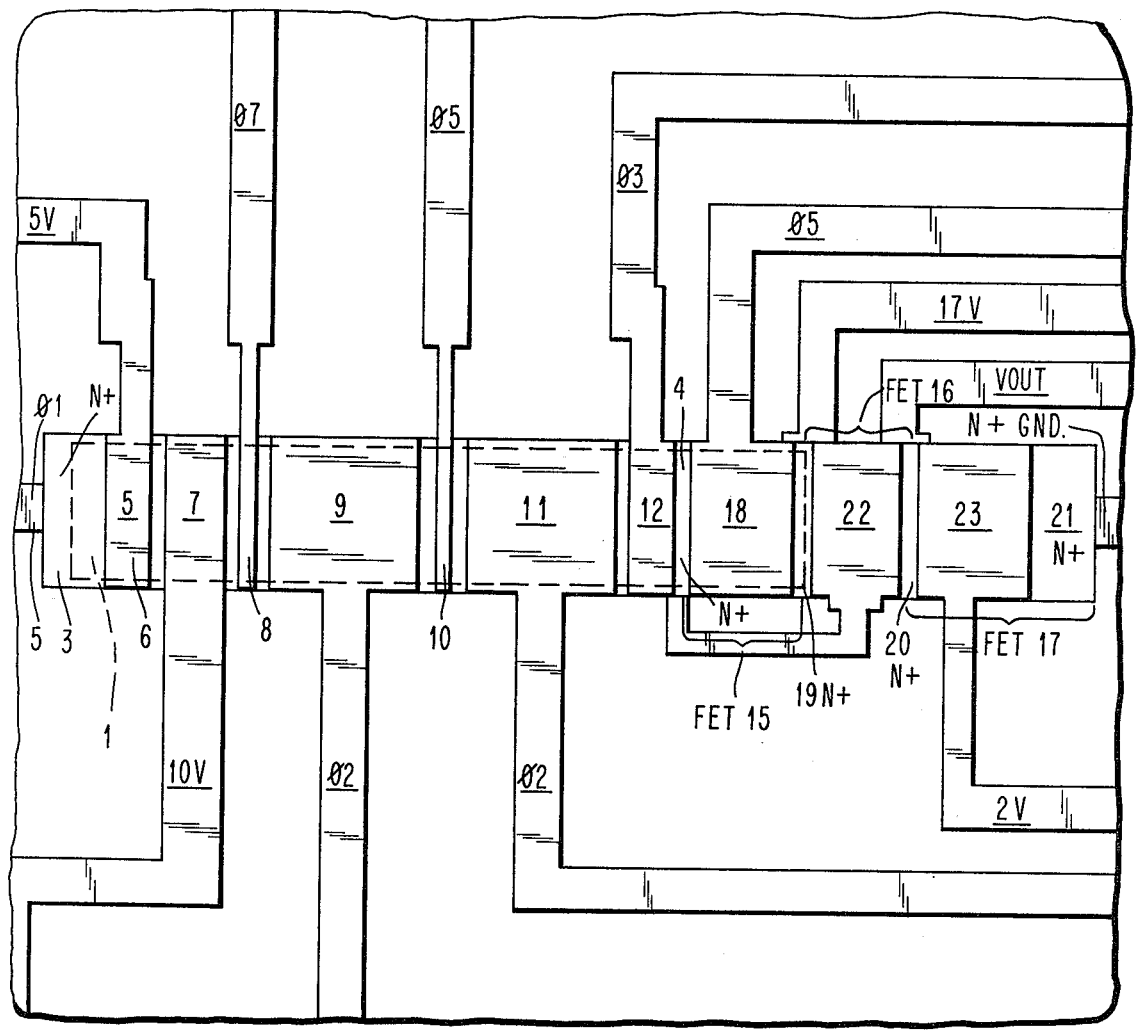
FIG. 3 is a plan view of an optional embodiment wherein the converter as well as the schematically represented field effect transistors of FIG. 1 are included in one integrated circuit.

FIG. 3 is a plan view of an integrated circuit device embodying all of the structure shown in FIG. 1 including transistors 15, 16 and 17. The structural elements of FIG. 3 corresponding to those shown in FIG. 1 are designated by the same numbers. Output N+ diffusion 4, in the integrated structure of FIG. 3, also serves as the source of FET 15 whose structure is completed by gate 18 and drain 19. The N+ diffusion 19 serving as the drain of FET 15 also serves as the drain of FET 16. The source of FET 16 and the drain of FET 17 are formed by N+ diffusion 20. N+ diffusion 21 forms the grounded N+ source of FET 17. Gates 22 and 23 complete the structure of integrated FET's 16 and 17, respectively.

It should be noted that charge splitting gates 9 and 11 are conductively connected together in the preferred embodiment to receive the same potential at all times. Additionally, the voltages on the gates immediately adjacent the splitting gates, i.e., gates 8 and 12, also are equal during the charge splitting interval $t_0$. Consequently, the fringing fields are made substantially identical with the result that the charge splitting potential wells are substantially identical for maximum charge splitting accuracy. Inasmuch as the accuracy of the overall binary-to-analog conversion heavily depends upon the accuracy with which the charge splitting is accomplished, maximum accuracy of conversion is achieved.

Although areas 1, 3 and 4 are termed diffused areas in the preceding specification, it will be observed by those skilled in the art that they may also be formed by impurity implantation, if desired.

While the invention has been particularly shown and described with reference to the preferred embodiment thereof, it will be understood by those skilled in the art that various changes in form and details may be made therein without departing from the spirit and scope of the invention.

What is claimed is:

1. A digital-to-analog converter comprising:
   a semiconductor substrate, an insulating layer on said substrate, a source of charge carriers in said substrate, a source of input serial digital signals, least significant digit first, said signals being applied to said source of charge carriers to produce a series of charge carriers corresponding to said input digital signals, a first charge splitting gate on said layer, a first control gate on said layer between said source and said first charge splitting gate, a second charge splitting gate on said layer, a second control gate on said layer between said first and second charge splitting gates, a collector of charge carriers in said substrate, and a third control gate on said layer between said second charge splitting gate and said collector, said gates being adapted to receive a predetermined sequence of control signal pulses independent of the value of the number represented by an input digital signal whereby (1) a charge carrier corresponding to a respective one of said input signals is admitted, by action of said first control gate, to a first charge storage well beneath said first charge splitting gate, (2) said admitted charge carrier is additively combined with any charge carrier pre-existing in said well, (3) the additively combined charge carriers are equally divided, by action of said second control gate, between said first charge storage well and a second charge storage well beneath said second charge splitting gate, and (4) the divided charge carrier in said second well is admitted, by action of said third control gate, to said collector whereby serial digital-to-analog conversion is accomplished.

2. The converter defined in claim 1 wherein said source of charge carriers and said collector of charge carriers are first and second areas of conductivity type opposite to the conductivity type of said substrate.

3. The converter defined in claim 2 and further including a third area of conductivity type opposite to the conductivity type of said substrate, said third area being of lesser impurity concentration than that of said first and second areas and extending between said first and second areas.

4. The converter defined in claim 1 wherein said first and second charge splitting gates are conductively connected together.

5. The converter defined in claim 1 wherein said first, second and third control gates all receive signal pulses of the same amplitude during one portion of said sequence of control signal pulses.

6. The converter defined in claim 1 and further including means for resetting the potential of said collector of charge carriers, said means being conductively connected to said second control gate.

7. The converter defined in claim 6 wherein said means for resetting is a field effect transistor, said collector of charge carriers constituting the source of said field effect transistor.

* * * * *